US008576958B2

(12) United States Patent
Gotman et al.

(10) Patent No.: US 8,576,958 B2
(45) Date of Patent: Nov. 5, 2013

(54) METHOD FOR SOFT MODULATION IN A WIRELESS TELECOMMUNICATION NETWORK

(75) Inventors: Maxim Gotman, Kfar Saba (IL); Avner Dor, Kfar Saba (IL); Eran Richardson, Petah Tikva (IL); Assaf Touboul, Natanya (IL)

(73) Assignee: Qualcomm Incorporated, San Diego, CA (US)

( * ) Notice: Subject to any disclaimer, the term of this patent is extended or adjusted under 35 U.S.C. 154(b) by 133 days.

(21) Appl. No.: 13/185,526

(22) Filed: Jul. 19, 2011

(65) Prior Publication Data

US 2012/0014480 A1    Jan. 19, 2012

Related U.S. Application Data

(60) Provisional application No. 61/365,392, filed on Jul. 19, 2010.

(51) Int. Cl.
*H04L 27/06*      (2006.01)

(52) U.S. Cl.
USPC .......... 375/340; 375/341; 375/316; 375/377; 375/259; 375/260; 375/261; 714/796; 714/795; 714/792; 714/786; 714/746

(58) Field of Classification Search
USPC ......... 375/341, 316, 377, 259, 260, 261, 262, 375/340, 148, 150; 714/796, 795, 792, 786, 714/746, 699, 780
See application file for complete search history.

(56) References Cited

U.S. PATENT DOCUMENTS

| | | | | |
|---|---|---|---|---|
| 2004/0202231 A1* | 10/2004 | Wang et al. | | 375/148 |
| 2006/0212781 A1* | 9/2006 | Hewitt et al. | | 714/780 |
| 2009/0175389 A1* | 7/2009 | Huang et al. | | 375/341 |
| 2010/0158161 A1* | 6/2010 | Sambhwani et al. | | 375/341 |

FOREIGN PATENT DOCUMENTS

| | | |
|---|---|---|
| EP | 1748610 A1 | 1/2007 |
| EP | 1748610 A1 * | 1/2007 |

OTHER PUBLICATIONS

Sadjadpour, "Maximum A Posteriori Decoding Algorithms for Turbo Codes", 2000, Proceedings SPIE vol. 4045, total 11 pages.*
Myoung-Cheol Shin et al., "SIMD Processor-Based Turbo Decoder Supporting Multiple Third-Generation Wireless Standards", 2007, IEEE, total 10 pages.*
Communication re European Search Report, EP App. No. 11174487. 6, EPO, Jun. 11, 2013, 6 pgs.
Tuechler et al., Turbo Equalization: Principles and New Results, IEEE Transactions on Communications, May 1, 2002, pp. 754-767, vol. 50, No. 5, Piscataway, New Jersey, US, 14 pgs.

* cited by examiner

*Primary Examiner* — Sam K Ahn
*Assistant Examiner* — Fabricio R Murillo Garcia

(57) ABSTRACT

A method for soft remodulation in a receiver of transmissions over a wireless telecommunication system, the method including obtaining from a FEC decoder a-posteriori LLR values, converting the a-posteriori LLR values into bit probabilities and computing improved soft symbols estimates as expected values using the bit probabilities in a recursive algorithm. Preferably, the step of converting is implemented using a pre-computed Look Up Table (LUT). Preferably, the step of computing is implemented in a Multiplier-Accumulator having a SIMD structure.

20 Claims, 1 Drawing Sheet

METHOD FOR SOFT MODULATION IN A WIRELESS TELECOMMUNICATION NETWORK

FIELD OF THE INVENTION

The present invention relates to wireless telecommunications systems, in general and, in particular, to a method for computation of soft quadrature amplitude modulation (QAM) symbols, using improved LLRs.

BACKGROUND OF THE INVENTION

Modern communication systems, especially wireless communication systems, in order to provide enhanced performance in terms of packet error rate (PER) over selective fading communications channels, make use of advanced iterative equalization and decoding techniques. These schemes may include Turbo Equalization (TEQ) when a single stream (SISO) is transmitted and received, and Parallel or Successive Interference Cancellation (PIC or SIC, respectively), when multiple streams are transmitted and detected over MIMO (Multiple In Multiple Out) channels. In all the above iterative equalization and decoding schemes, when deployed in the receiver, all except the $1^{st}$ iteration make use of the improved LLRs (Log Likelihood Ratios) obtained from the FEC (Forward Error Correcting) decoder output at the end of the previous iteration(s). This feedback information, improved LLR stream, is used to eventually compute estimated QAM symbols corresponding to the stream. These estimated QAM symbols, in combination with an estimated channel matrix, provide a basis for estimating and removing the interference caused by the stream from the received signal on the next iteration of equalization and decoding.

The aforementioned estimation of QAM symbols, or soft-modulation, includes computing probabilities from LLRs for each transmitted bit, then computing 'soft' QAM symbols from each K bit probabilities, with $M=2^K$ being the constellation order (K=2 for QPSK, K=4 for 16QAM, K=6 for 64 QAM, K=8 for 256QAM). A straight-forward approach to the soft modulation would involve a computational complexity growing exponentially with K (linearly in M). Since soft modulation is performed on each iteration of TEQ/SIC/PIC, there is a clear need for a reduced complexity algorithm for converting bit probabilities to soft QAM symbols.

SUMMARY OF THE INVENTION

The present invention relates to a method and system for soft QAM computation in the receiver. In particular, the present invention relates to a method for computation of soft quadrature amplitude modulation (QAM) symbols, using improved LLRs, during operation of turbo equalization or iterative interference cancellation decoding in the receiver.

There is provided, according to the present invention, an algorithm for soft modulation of M-QAM constellation symbols using constituent bit probabilities, whose computational complexity grows linearly in $K=\log_2(M)$ (or logarithmically in M).

In particular, there is provided a method for soft remodulation in a receiver of transmissions over a wireless telecommunication system, the method including receiving a-posteriori LLR values from a FEC decoder, converting said a-posteriori LLR values into bit probabilities in a processor, preferably using a pre-computed Look Up Table (LUT) stored in memory, and computing, in the processor, improved soft symbols estimates as expected value using the bit probabilities in a recursive algorithm.

According to some embodiments, the step of computing is implemented in a Multiplier-Accumulator having SIMD structure.

According to some embodiments, the step of receiving includes receiving estimates of multiple soft symbols, calculating the multiple soft symbols into multiple a-priori LLR values, feeding the LLR values to a FEC decoder and obtaining from the FEC decoder improved a-posteriori LLR values.

According to a preferred embodiment, the step of computing includes the following steps:

given bit probabilities $P_i(b_i=1)$, $i=1, \ldots, q$, for $q=k/2$ bits, computing a first stage expected value as $E_1=1-2P_1$;
if q=1, outputting this expected value;
if q>1, recursively computing for each of k=2 to k=q, $E_k=(2P_k-1)\cdot(E_{k-1}-2^{q-1})$; and
if q>1, then computing $t_j=E_q$, and outputting this calculated expected value.

There is also provided, according to embodiments of the invention, a modulator, in a receiver, for soft remodulation of transmissions over a wireless telecommunication system, the modulator including a processor obtaining from a FEC decoder a-posteriori LLR values, a pre-computed Look Up Table (LUT) stored in memory converting the a-posteriori LLR values into bit probabilities, and a soft symbol calculator computing improved soft symbols estimates as expected values using the bit probabilities in a recursive algorithm.

There is further provided, according to embodiments of the invention, a computer program product comprising instructions which, when carried out by a processor, cause the processor to perform the following steps: obtain from a FEC decoder a-posteriori LLR values, convert the a-posteriori LLR values into bit probabilities, preferably using a pre-computed Look Up Table (LUT), and compute improved soft symbols estimates as expected value using the bit probabilities in a recursive algorithm, preferably in a Multiplier-Accumulator having a SIMD (Single Instruction Multiple Data) architecture.

BRIEF DESCRIPTION OF THE DRAWINGS

The present invention will be further understood and appreciated from the following detailed description taken in conjunction with the drawings in which.

DETAILED DESCRIPTION OF THE INVENTION

Figure 1:
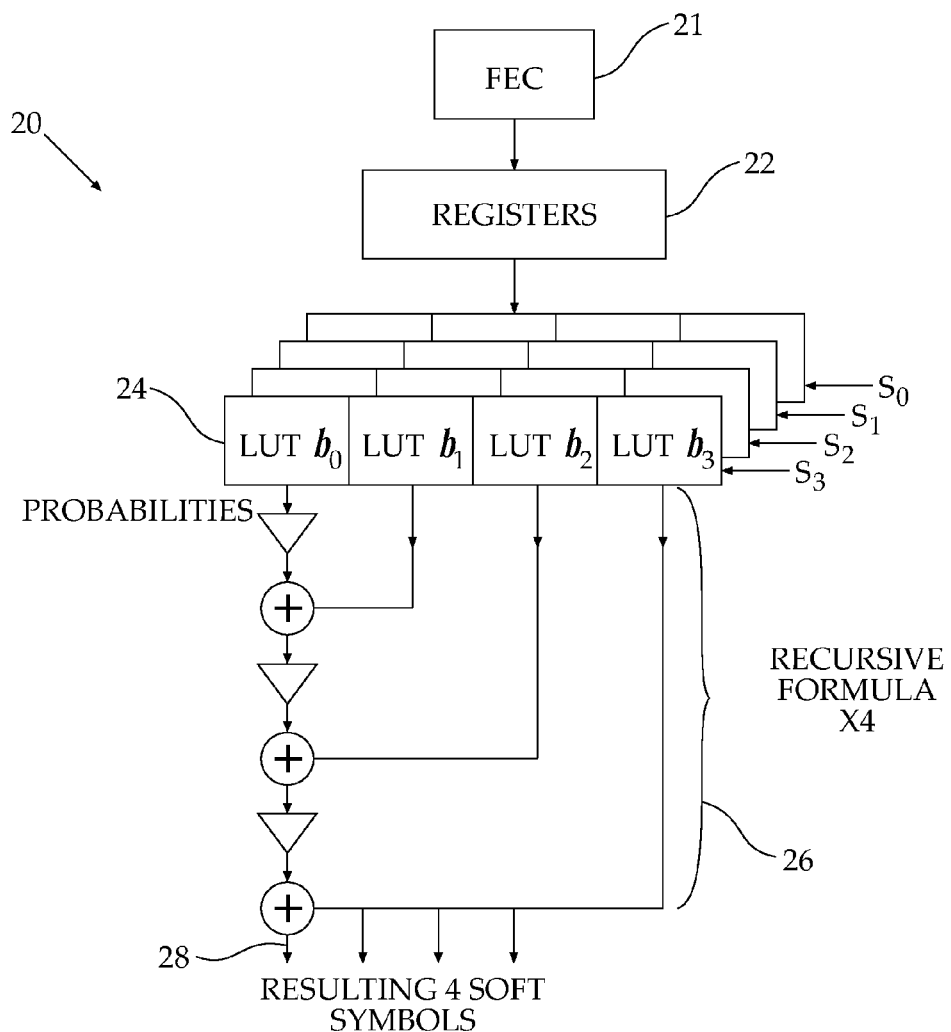
FIG. 1 is a schematic illustration of a modulator used for soft modulating multiple symbols using SIMD architecture, constructed and operative in accordance with one embodiment of the present invention.

The present invention relates to a method for wireless telecommunication providing efficient (fast) implementation of soft QAM symbols computation. This is accomplished by providing efficient soft remodulation in a receiver of transmissions over a wireless telecommunication system. The method includes receiving estimates of multiple soft symbols and calculating multiple a-priori LLR values from these multiple soft symbols. The LLR values are fed to a Forward Error Correcting (FEC) decoder and improved a-posteriori LLR values are obtained from the FEC decoder. These a-posteriori LLR values are converted into bit probabilities, preferably using a pre-computed Look Up Table (LUT), and improved soft symbols estimates are computed, preferably using SIMD (Single Instruction Multiple Data) architecture, as expected values using the bit probabilities in a recursive algorithm.

In a general case, given that M-QAM constellation symbols are transmitted and received, for each demodulated M-QAM soft symbol $d_k$ with independent a-posteriori probabilities $P_i(b_k=1)$ of its decoded constituent soft bits of being '1', $k=1, 2, \ldots, K=\log_2(M)$, the remodulated version of $d_i$, $\hat{s}_k$, is computed as an expected value according to the whole probability formula $$\hat{s}_k = E(s_k^i) = \sum_{i=1}^{M} s^i P_i(k) \quad (1)$$

where $s^i$, $i=1, \ldots, M$, represent the nominal M-QAM constellation points, $$P_i(k) = P(s_k = s^i) = \prod_{j=1}^{K} P(b_{k,j} = b_{i,j}) \quad (2)$$

is the probability of a soft demodulated symbol $s_k$ to be the constellation symbol $s^i$, given the probabilities of its constituent bits.

Clearly, equation (1) has computational complexity linear in M, exponential in K, which the present invention scales down to be logarithmic in M and linear in K.

Without a loss of generality and in accordance with the approach accepted in industry standards (WiMAX, LTE, HSPA, etc.), we assume that BICM, bit-interleaved coded modulation, is used to Gray-map K-tuples of bits to M-QAM symbols, $M=2^K$. With BICM, each of the K bits in the K-tuple is coded across only one axis (either real or imaginary) of the complex M-QAM constellation, and thus affects only the real or the imaginary component, respectively, of the corresponding M-QAM symbol. Therefore, with BICM, the task of encoding K-tuples of bits into a complex M-QAM symbol, $M=2^K$, is split into two independent real mappings of q-tuples of bits each, $q=K/2$, onto a real or an imaginary part, each belonging to a set of size $M^{1/2}$. For example, for K=2 (QPSK, M=4) each bit in a 2-tuple will define one of 2 possible values $\{-1, 1\}$ in either the real or imaginary dimension; for K=4 (16QAM, M=16), two pairs of bits in a 4-tuple will be mapped across one of the possible dimensions on one of 4 possible values $\{-3, -1, 1, 3\}$ each pair; for K=6 (64QAM, M=64), two 3-tuples will be mapped to one of eight values out of the set $\{-7, -5, -3, -1, 1, 3, 5, 7\}$ each; for K=8 (256QAM, M=256), two 4-tuples will be mapped to one of 16 values out of the set $\{-15, -13, -11, -9, -7, -5, -3, -1, 1, 3, 5, 7, 9, 11, 13, 15\}$ each.

To index each of the 2 dimension q half-symbols $t^i$, we use the following notation:

$$t^i = 2 \cdot i - 2^q - 1, i=1, \ldots, 2^q \quad (3)$$

Then, per dimension, equation (1) can be rewritten $$\hat{t}_k = E(t_k^i) = \sum_{i=1}^{\sqrt{M}} t^i P_i(k) \quad (4)$$

with $$P_i(k) = P(t_k = t^i) = \prod_{j=1}^{q} P(b_{k,j} = b_{i,j}) \quad (5)$$

Still, equation (4) is linear in each dimension's size, $2^q$, and is exponential in q.

In order to scale it down to be linear in q, the current invention uses the following recursive algorithm.

Given the bit probabilities $P_i(b_i=1)$, $i=1, \ldots, q$, the first stage expected value is computed as $E_1=1-2P_1$. If $q=1$, the algorithm stops here, since according to (4), $t_j=1-2P_1=E_1$ for each dimension of QPSK mapping bit '1' to $t^1=-1$ and bit '0' to $t^2=1$.

If $q>1$, the recursion continues as follows: for $k=2$ to $k=q$, $$E_k = (2P_k - 1) \cdot (E_{k-1} - 2^{q-1}) \quad (6)$$

and finally $t_j = E_q$.

Noticing that values $(2P_k-1)$ can be precomputed as a function of LLR and stored in a look-up memory, rather than requiring computation each time, it's clear that the recursive computation in (6) of a value from a $2^q$-size set, takes (q−1) real multiplications and additions, thus, having a linear in q complexity.

It will be appreciated that the algorithm equally serves any variation of BICM bit ordering (e.g., q MS bits to real/q MS bits to imaginary, or even bits to real/odd bits to imaginary, little/big endian, etc.) and is suited to any currently known and emerging (WiMAX, LTE, LTE-A, HSPA) industry standard.

One example of a modulator 20 for performing soft modulation on multiple symbols, according to the present invention, using SIMD architecture, is illustrated schematically in FIG. 1. The illustrated embodiment can handle up to N=4 symbols (suitable for BPSK to 256QAM) and is implemented by SIMD4—remodulation of up to four symbols in parallel, typically real or imaginary. Since the corresponding imaginary or real symbols can also be modulated in parallel at the same time, the invention can operate like a SIMD8, providing remodulation of up to 8 symbols in parallel.

Figure 2:
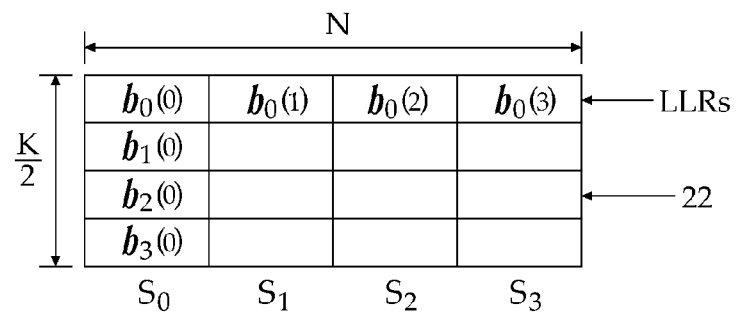
FIG. 2 is a schematic illustration of a register holding data of four LLRs, real or imaginary, for a single cycle of soft modulation, according to one embodiment of the present invention.

Modulator 20 is coupled to a FEC decoder 21 and receives a-posteriori LLR values which have been calculated from the initial received soft symbols in the FEC decoder. According to some embodiments of the invention, the modulator or other processor receives estimates of received multiple soft symbols, calculates multiple a-priori LLR values from the multiple soft symbols estimates, and feeds the LLR values to the FEC decoder, in order to obtain from the FEC decoder improved a-posteriori LLR values. The processor of modulator 20 arranges the incoming data steam of symbols (LLR values) in a plurality of virtual registers 22, one of which is shown in FIG. 2, typically after dividing LLR values into two groups, real and imaginary. The registers 22 address Look Up Tables (LUT) 24 stored in memory. Processor 20 performs the remodulation—accesses Look Up Tables 24 to get the probability values and performs recursive calculation of the bit probabilities, preferably in a multiplier-accumulator 26 with SIMD structure. The resulting improved soft symbols 28 are output from the modulator, typically to the next iteration of a turbo-equalizer/PIC or SIC (Parallel or Sequential Interference Cancellation) algorithm, as expected values of the incoming symbols.

Thus, the modulator of the present invention includes a processor and a memory to store and execute program instructions to perform the functionality discussed herein. The invention also includes a computer program product comprising instructions which, when carried out by a processor, cause the processor to perform the following steps: obtain from a FEC decoder a-posteriori LLR values, convert the a-posteriori LLR values into bit probabilities, preferably using a pre-computed Look Up Table (LUT), and compute improved soft symbols estimates as expected value using the bit probabilities in a recursive algorithm, preferably using a SIMD (Single Instruction Multiple Data) architecture.

While the invention has been described with respect to a limited number of embodiments, it will be appreciated that many variations, modifications and other applications of the invention may be made. It will further be appreciated that the invention is not limited to what has been described hereinabove merely by way of example. Rather, the invention is limited solely by the claims which follow.

The invention claimed is:

1. A method for soft remodulation, in a receiver, of transmissions over a wireless telecommunication system, the method comprising:
obtaining from a Forward Error Correction (FEC) decoder a-posteriori log likelihood ratio (LLR) values in a processor;
converting, in said processor, said a-posteriori LLR values into bit probabilities; and
computing, in said processor, a soft symbol estimate as an expected value of a received half-symbol based on said bit probabilities according to a calculation comprising a number of recursive stages defined by a dimension (q) of said half-symbol, wherein computing said soft symbol estimate includes computing a first stage expected value as $E_1=1-2P_1$, where $E_1$ comprises said first stage expected value and $P_1$ comprises a first one of said bit probabilities.

2. The method according to claim 1, wherein said converting is implemented using a pre-computed Look Up Table (LUT) stored in memory.

3. The method according to claim 1, wherein said computing is implemented in a Multiplier-Accumulator having a Single Instruction Multiple Data (SIMD) architecture.

4. The method according to claim 1, wherein said obtaining includes:
receiving estimates of multiple soft symbols in said processor;
converting, with said processor, said multiple soft symbols into multiple a-priori LLR values; and
feeding said LLR values to said FEC decoder to obtain said a posteriori LLR values.

5. The method according to claim 1, wherein said dimension (q) of said half-symbol is equal to 1, the method further comprising:
outputting said first stage expected value as said expected value of said received half-symbol.

6. The method according to claim 1, wherein said dimension (q) of said half-symbol is greater than 1, the method further comprising:
calculating said expected value of said half-symbol according to $$E_k=(2P_k-1)\cdot(E_{k-1}-2^{q-1})$$

as evaluated at k=q, where $E_k$ represents a $k^{th}$ stage expected value calculation, and $P_k$ represents a $k^{th}$ one of said bit probabilities associated with said half-symbol.

7. The method according to claim 6, further comprising:
pre-computing values of $(2P_k-1)$ as a function of LLR;
storing said pre-computed values in a look-up table (LUT) of a memory; and
accessing said pre-computed values during said computing said soft symbol estimate.

8. A modulator, in a receiver, for soft remodulation of transmissions over a wireless telecommunication system, the modulator comprising:
a processor configured to obtain from a FEC decoder a-posteriori LLR values;
a Look Up Table (LUT) stored in memory, said LUT comprising a plurality of pre-computed bit probabilities associated with said a-posteriori LLR values; and
a soft symbol calculator configured to compute a soft symbol estimate as an expected value of a received half-symbol based on said bit probabilities according to a calculation comprising a number of recursive stages defined by a dimension (q) of said half-symbol, wherein computing said soft symbol estimate includes computing a first stage expected value as $E_1=1-2P_1$, where $E_1$ comprises said first stage expected value and $P_1$ comprises a first one of said bit probabilities.

9. The modulator according to claim 8, wherein said soft symbol calculator is a multiplier-accumulator with Single Instruction Multiple Data (SIMD) architecture.

10. The modulator according to claim 8, wherein said processor is further configured to:
receive estimates of multiple soft symbols;
convert said multiple soft symbols into multiple a-priori LLR values;
feed said LLR values to said FEC decoder to obtain said a posteriori LLR values.

11. The modulator according to claim 8, wherein said dimension (q) of said half-symbol is equal to 1, and said soft symbol calculator is further configured to:
output said first stage expected value as said expected value of said received half-symbol.

12. The modulator according to claim 8, wherein said dimension (q) of said half-symbol is greater than 1, and said soft symbol calculator is further configured to:
calculate said expected value of said half-symbol according to $$E_k=(2P_k-1)\cdot(E_{k-1}-2^{q-1})$$

as evaluated at k=q, where $E_k$ represents a $k^{th}$ stage expected value calculation, and $P_k$ represents a $k^{th}$ one of said bit probabilities associated with said half-symbol.

13. A computer program product comprising:
a non-transitory computer-readable medium comprising instructions which, when carried out by a processor, cause the processor to:
obtain from a Forward Error Correction (FEC) decoder a-posteriori log likelihood ratio (LLR) values;
convert the a-posteriori LLR values into bit probabilities; and
compute a soft symbol estimate as an expected value of a received half-symbol based on the bit probabilities according to a calculation comprising a number of recursive stages defined by a dimension (q) of said half-symbol, wherein computing said soft symbol estimate includes computing a first stage expected value as $E_1=1-2P_1$, where $E_1$ comprises said first stage expected value and $P_1$ comprises a first one of said bit probabilities.

14. The computer program product of claim 13, wherein said non-transitory computer-readable medium comprises instructions which cause the processor to:
convert the a-posteriori LLR values using a pre-computed Look Up Table (LUT).

15. The computer program product according to claim 13, wherein said dimension (q) of said half-symbol is equal to 1, and said non-transitory computer-readable medium further comprises instructions causing said processor to:
output said first stage expected value as said expected value of said received half-symbol.

16. The computer program product according to claim 13, wherein said dimension (q) of said half-symbol is greater than 1, and said non-transitory computer-readable medium further comprises instructions causing said processor to:
calculate said expected value of said half-symbol according to $$E_k=(2P_k-1)\cdot(E_{k-1}-2^{q-1})$$

as evaluated at k=q, where $E_k$ represents a $k^{th}$ stage expected value calculation, and $P_k$ represents a $k^{th}$ one of said bit probabilities associated with said half-symbol.

17. A receiver apparatus for soft remodulation of transmissions over a wireless telecommunication system, comprising:
means for obtaining from a Forward Error Correction (FEC) decoder a-posteriori log likelihood ratio (LLR) values;
means for converting said a-posteriori LLR values into bit probabilities; and
means for computing a soft symbol estimate as an expected value of a received half symbol based on said bit probabilities according to a calculation comprising a number of recursive stages defined by a dimension (q) of said half-symbol, wherein computing said soft symbol estimate includes computing a first stage expected value as $E_1=1-2P_1$, where $E_1$ comprises said first stage expected value and $P_1$ comprises a first one of said bit probabilities.

18. The receiver apparatus of claim 17, further comprising:
means for receiving estimates of multiple soft symbols;
means for converting said multiple soft symbols into multiple a-priori LLR values; and
means for feeding said LLR values to said FEC decoder to obtain said a posteriori LLR values.

19. The receiver apparatus of claim 17, wherein said dimension (q) of said half-symbol is equal to 1, and said soft symbol calculator is further configured to:
output said first stage expected value as said expected value of said received half-symbol.

20. The receiver apparatus according to claim 17, wherein said dimension (q) of said half-symbol is greater than 1, said receiver apparatus further comprising:
means for calculating said expected value of said half-symbol according to $$E_k=(2P_k-1)\cdot(E_{k-1}-2^{q-1})$$

as evaluated at k=q, where $E_k$ represents a $k^{th}$ stage expected value calculation, and $P_k$ represents a $k^{th}$ one of said bit probabilities associated with said half-symbol.

* * * * *